United States Patent
Chang et al.

[11] Patent Number: 6,141,761
[45] Date of Patent: Oct. 31, 2000

[54] LOW POWER CONSUMING OPERATING DEVICE FOR DIGITAL SIGNAL PROCESSING USING A PROBABILITY DISTRIBUTION OF INPUT DIGITAL SIGNALS AND PREDETERMINED OUTPUT SIGNALS

[75] Inventors: Ho-rang Chang, Inchon; Jin-kuc Cho; Young-hoon Chang, both of Suwon, all of Rep. of Korea

[73] Assignee: Samsung Electronics Co., Ltd., Suwon, Rep. of Korea

[21] Appl. No.: 08/964,014

[22] Filed: Nov. 4, 1997

[30] Foreign Application Priority Data

Nov. 5, 1996 [KR] Rep. of Korea ............... 96-52160
Oct. 6, 1997 [KR] Rep. of Korea ............... 97-51269

[51] Int. Cl.[7] .................. G06F 1/26; G06F 1/32
[52] U.S. Cl. .......... 713/300; 713/310; 713/320; 713/330; 713/340
[58] Field of Search .................. 713/300, 310, 713/320, 321, 330, 340, 322, 324, 323

[56] References Cited

U.S. PATENT DOCUMENTS

| 5,276,784 | 1/1994 | Ohki ......................... 345/427 |
| 5,301,136 | 4/1994 | McMillan, Jr. et al. ........... 708/402 |
| 5,367,335 | 11/1994 | Murakami et al. ............... 348/405 |
| 5,729,754 | 3/1998 | Estes ........................ 712/1 |

FOREIGN PATENT DOCUMENTS

| 217412 | 4/1987 | European Pat. Off. . |
| 2263834 | 8/1993 | United Kingdom . |
| 2308253 | 6/1997 | United Kingdom . |
| 2313511 | 11/1997 | United Kingdom . |

*Primary Examiner*—Ario Etienne
*Attorney, Agent, or Firm*—Burns, Doane, Swecker & Mathis, L.L.P.

[57] ABSTRACT

There is provided a low power consuming operating device for digital signal processing, which analyses a digital signal to be operated, determines whether the digital signal is a frequently encountered specified signal, and outputs a previously calculated value when the digital signal is the specified signal. The operating device has an external input portion for receiving digital data, temporarily storing the received digital data, and outputting the stored data, a specified signal sensing portion for determining whether the digital data received from the external input portion is a specified input and outputting the determination result, an internal input portion for outputting the digital data from the external input portion in response to the determination result, an operating portion for operating on the data received from the internal input portion, and an external output portion for selectively outputting either the output of the operating means or a value corresponding to the specified input, in response to the determination result, as the final operation result of the digital data. Thus, power consumption is reduced, average operation speed is increased, and operational failures caused by noise in an internal control signal can be prevented when a specified signal is sensed using a self-timed method.

7 Claims, 8 Drawing Sheets

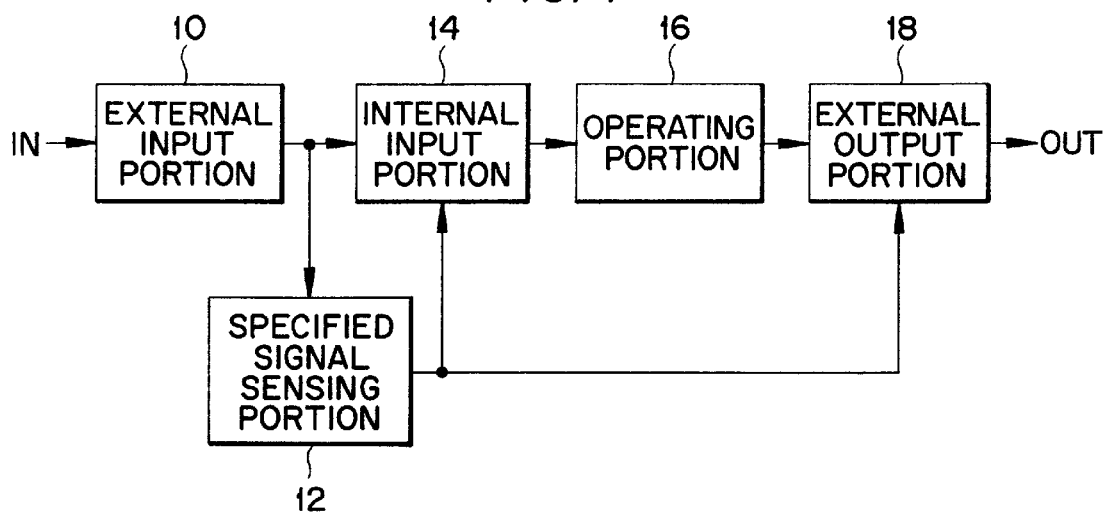
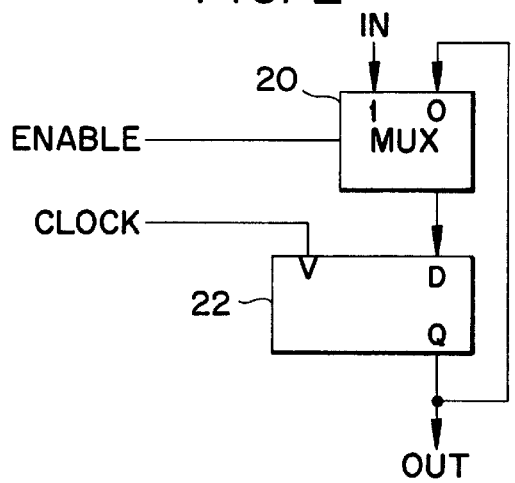
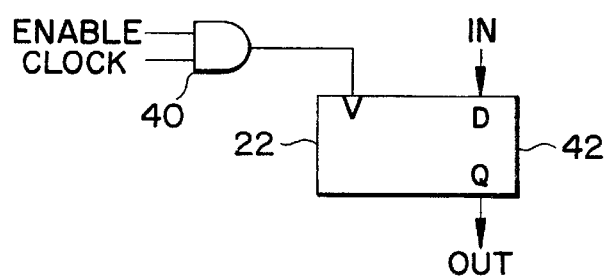

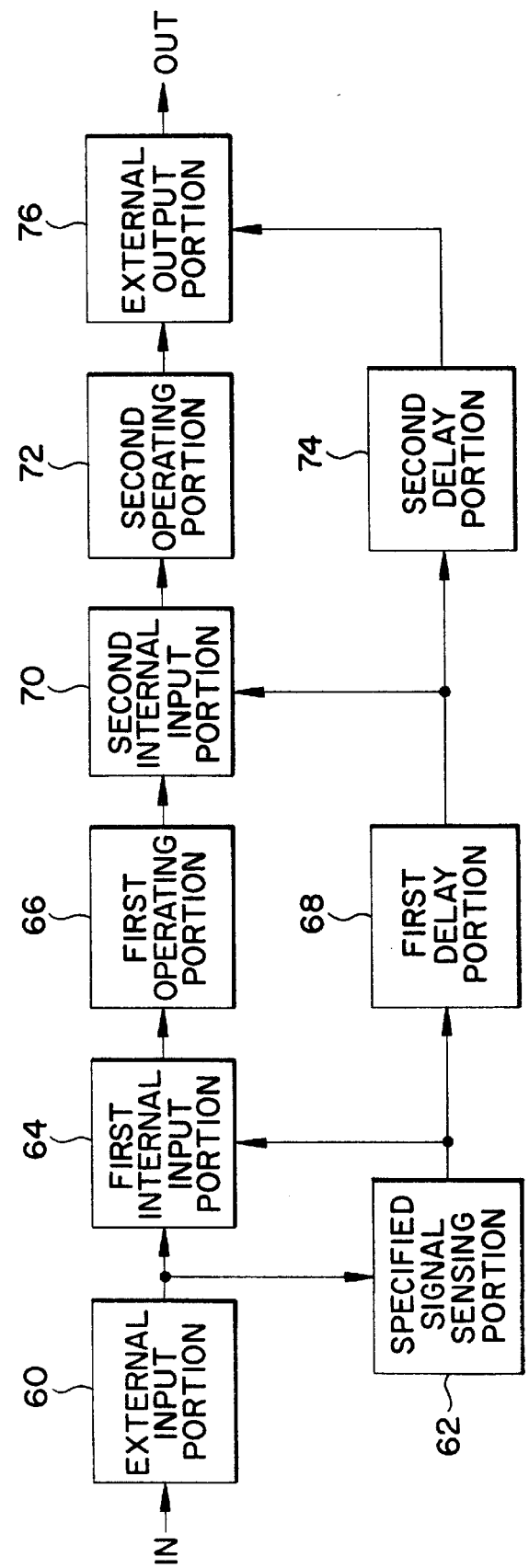

LOW POWER CONSUMING OPERATING DEVICE FOR DIGITAL SIGNAL PROCESSING USING A PROBABILITY DISTRIBUTION OF INPUT DIGITAL SIGNALS AND PREDETERMINED OUTPUT SIGNALS

BACKGROUND OF THE INVENTION

1. Field of the Invention

The present invention relates to an operating device, and more particularly, to a low power consuming operating device for digital signal processing, which reduces power consumption using a probability distribution of input digital signals.

2. Description of the Related Art

With the advent of the multimedia era, power consumption has emerged as a significant concern in digital signal processing. Power consumption is very important for reducing heat generation and for system stability. As system size increases, some systems have several hundred multipliers. The increasing demand for mobile and portable electronic devices requires digital signal processing systems which operate longer at low power from a single battery. Low power consumption is especially important for mobile phone systems especially.

A conventional operating circuit stores a digital input in accordance with clock pulses and just operates on the stored input. However, this operating circuit has the problem that much power is used and operation speed decreases. This is because a probability distribution of the input signal is neglected, and thus the same operation is repeatedly performed upon the same input in a system or circuit using a specific input pattern frequently.

Another problem with the conventional operating device is that it uses a synchronization circuit for synchronization of input and output. This results in unnecessary power consumption in the case when the input varies when the operating device need not operate and thus a portion of an input circuit operates. The synchronization circuit will be described in detail later.

SUMMARY OF THE INVENTION

An object of the present invention is to provide a low power consuming operating device for digital signal processing, which determines by analysis whether a digital input signal to be operated on is a specified signal having a high occurrence probability and outputs a previously calculated value if the input signal is the specified signal.

Another object of the present invention is to provide a low power consuming operating device adopting a pipe line structure, for digital signal processing.

To achieve the above first object, there is provided a low power consuming operating device for digital signal processing, comprising:

external input means for receiving digital data, temporarily storing the digital data, and outputting the stored data;

specified signal sensing means for determining whether the digital data received from the external input means is a specified input and outputting the determination result;

internal input means for outputting the digital data received from the external input means, in response to the determination result;

operating means for operating on the data output from the internal input means; and external output means for selectively outputting either the temporarily stored output of the operating means or an output value corresponding to the specified input, as the resulting operated value of the digital data, in response to the determination result.

To achieve the second object of the present invention, there is provided a low power consuming operating device for digital signal processing, comprising:

external input means for receiving digital data, temporarily storing the received digital data, and outputting the stored data;

specified signal sensing means for receiving the digital data from the external input means, determining whether the received digital data is a specified input, and outputting the determination result;

first internal input means for outputting the digital data received from the external input means in response to the determination result;

first operating means for receiving the data from the first internal input means and operating on the received data;

first delay means for delaying the determination result and outputting the delayed determination result;

second through nth internal input means (here, n is an integer greater than 1);

second through nth delay means;

second through nth operating means; and an external output means for selectively outputting either the data received from the nth operating means or an output value corresponding to the specified input, in response to the output of the nth delay means, as the operated resulting value of the digital data, wherein the nth internal input means outputs the data received from the (n-1)th operating means in response to the output of the (n-1) delay means, the nth operating means operates the data received from the nth internal input means, and the nth delay means delays the output of the (n-1)th delay means and outputs the delayed output.

BRIEF DESCRIPTION OF THE DRAWINGS

The above objects and advantages of the present invention will become more apparent by describing in detail preferred embodiments thereof with reference to the attached drawings in which:

FIG. 1 is a block diagram of an operating device according to the present invention;

FIG. 2 is a circuit diagram of a conventional external input portion;

FIG. 3 is a circuit diagram of a preferred embodiment of an external input portion according to the present invention;

FIG. 4 is a block diagram of an operating device having a two-stage pipe line structure according to the present invention;

DESCRIPTION OF THE PREFERRED EMBODIMENTS

Figure 5:
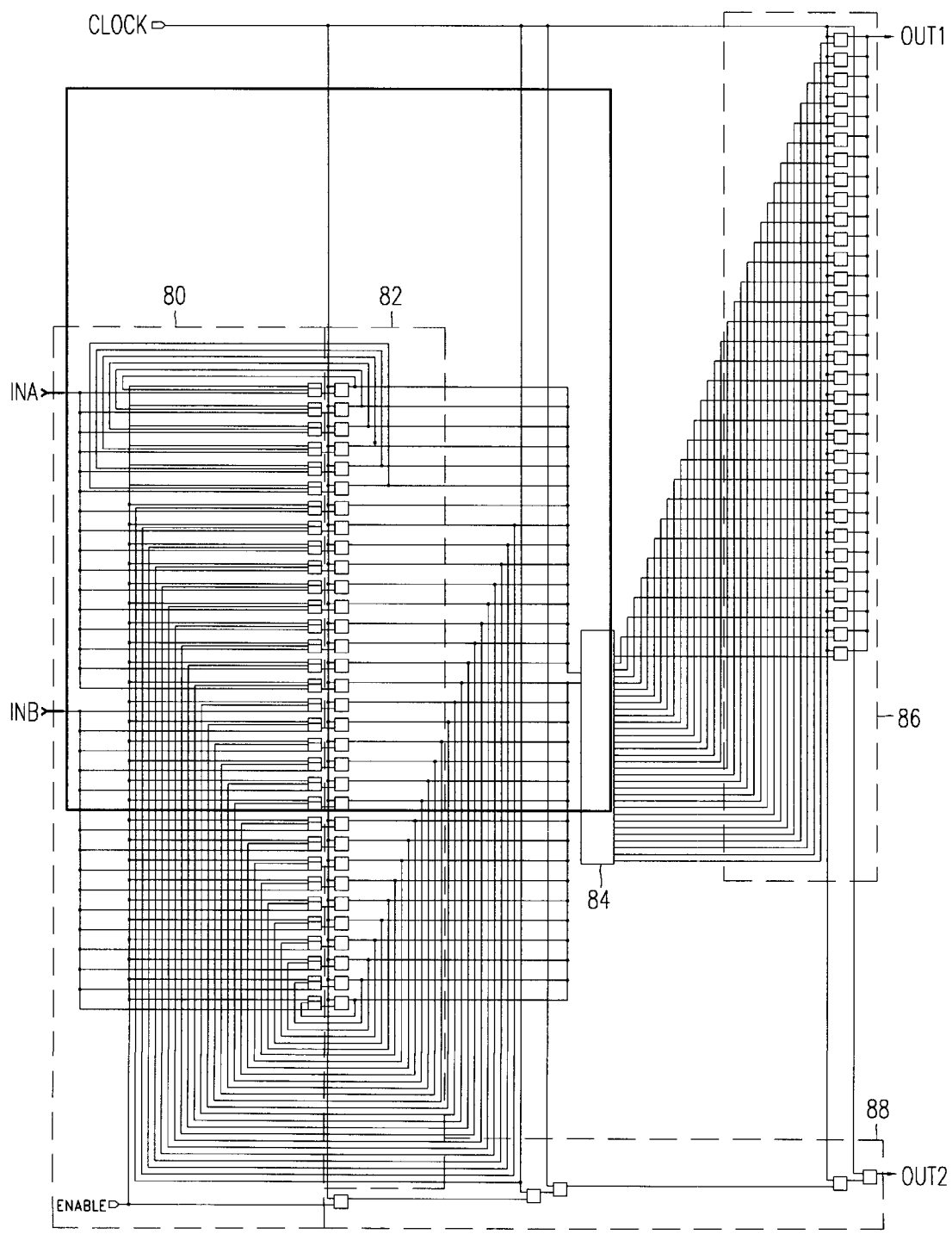
FIG. 5 is a circuit diagram of a conventional pipe line 16-bit multiplier used for IDCT.

FIG. 1 is a block diagram of an operating device according to the present invention. The operating device has an external input portion 10, a specified signal sensing portion 12, an internal input portion 14, an operating portion 16, and an external output portion 18. In FIG. 1, the external input portion 10 receives digital data via an input port IN, temporarily stores the digital data, outputs the stored digital signal to the specified signal sensing portion 12 and the internal input portion 14. The specified signal sensing portion 12 determines whether the digital data received from the external input portion 10 is a specified input, and outputs the result as a control signal for the internal input portion 14 and the external output portion 18. The internal input portion 14 receives the digital data from the external input portion 10 in response to the determination result, and outputs the digital data to the operating portion 16 or maintains a previous output value. That is, the value of the data output from the internal input portion 14 to the operating portion 16 is varied in response to the determination result.

The operating portion 16 operates on the data received from the internal input portion 14 and outputs the operation result to the external output portion 18. The external output portion 18 selectively output either the operation result received from the operating portion 16 or the previously calculated value for the specified input, as the final operation result of the digital data, in response to the determination result, via an output port OUT.

For example, many matrix multiplications are performed for an inverse discrete cosine transform (IDCT) in a video signal reproduction application such as an MPEG system. Here, only '0's are multiplied in many operations. If these operations are performed by a conventional multiplier, lots of circuit elements operate, thus resulting in much power consumption.

However, the operating device of the present invention performs these multiplications as follows.

The specified signal sensing portion 12 of FIG. 1 receives the data temporarily stored in the external input portion 10, and determines whether the data is a specified input, for example, zero for IDCT. If the data is the specified input, the specified signal sensing portion 12 controls the external output portion 18 to output the previously calculated value for the specified input, via the output port OUT, while controlling the internal input portion 14 to prevent the data output from the internal input portion 14 from varying. Thus, there is no dynamic power consumption in the operating device 16.

An investigation of IDCT inputs in MPEG shows that 30% or more of the inputs are only 'Os' and in some cases 50% are 'Os'. Here, use of the operating device of the present invention can reduce power consumption remarkably. That is, since the values of signal lines in the operating portion 16 experience no variation, if the operating portion 16 is comprised of CMOS, power consumption can be markedly reduced. This is because most of the power consumption in a CMOS circuit is dynamic power consumption incurred when a signal value varies. In addition, the specified input is sensed and its corresponding output is immediately generated, thereby increasing the average operation speed of the system.

FIG. 2 is a circuit diagram of a conventional external input portion 10. In the prior art, digital data is input via the input terminal IN by using a synchronization method. That is, the conventional external input portion 10 has a MUX 20 for selectively outputting either the data received via the input terminal IN or the output of a D-flipflop 22, in response to an enable signal ENABLE which is enabled to a high level to initiate an operation, and the D-flipflop 22 for receiving a signal CLOCK as a clock signal and a signal output from the MUX 20 as data D, and outputting a positive output Q to the MUX 20 via the output terminal OUT.

Therefore, at the moment when there is no need for operation, that is, when the enable signal ENABLE is at logic low level, the clock signal varies the inputs to several elements, thereby consuming power. In addition, capacitance of the input is increased by the MUX 20, also increasing power consumption.

FIG. 3 is a circuit diagram of a preferred embodiment of the external input portion 10, according to the present invention. The external input portion 10 of the present invention includes an AND gate 40 for AND-operating the enable signal ENABLE enabled to logic high level when an operation is needed and the signal CLOCK, and a D-flipflop 42 for receiving the output of the AND gate 40 as a clock signal, and receiving data received via the input terminal IN as data D and outputting the positive output Q to the specified signal sensing portion 12 and the internal input portion 14 via the output terminal OUT.

When the external input portion 10 adopting a gated clock as shown in FIG. 3 is used, clock pulses are input to the D-flipflop 42 only if the signal ENABLE is logic high, indicating that operation is needed. Hence, less current flows when no operation is needed, thus reducing power consumption. Also this technique ovbiates the need for the MUX 20, thereby reducing the circuit size.

The operation and structure of a low power consuming operating device employing a two-stage pipe line structure according to the present invention will be described.

FIG. 4 is a block diagram of the operating device employing a two-stage pipe line structure according to the present invention. The operating device has an external input portion 60, a specified signal sensing portion 62, a first internal input portion 64, a first operating portion 66, a first delay portion 68, a second internal input portion 70, a second operating portion 72, a second delay portion 74, and an external output portion 76.

The external input portion 60 shown in FIG. 4 receives digital data via an input port IN, temporarily stores the digital data, and outputs the stored data to the specified signal sensing portion 62 and the first input portion 64. The specified signal sensing portion 62 performs the same operation as the specified signal sensing portion 12 shown in FIG. 1, and outputs the determination result to the first internal input portion 64 and the first delay portion 68.

The first internal input portion 64 outputs the digital data received from the external input portion 60 to the first operating portion 66 in response to the determination result. The first operating portion 66 operates on the data received from the first internal input portion 64.

Meanwhile, the first delay portion 68 delays the determination result for a predetermined clock period, and outputs the delayed determination result to the second internal input portion 70 and the second delay portion 74. The second delay portion 74 delays the delayed determination result for another predetermined clock period, and then outputs the double-delayed determination result to the external output portion 76. Here, the delay time of each delay should be at least as long as the operation time of each operating portion.

The second internal input portion 70 outputs the data operated on by the first operating portion 66 to the second operating portion 72, in response to the output of the first delay portion 68, and the second operating portion 72 operates on the input data and outputs the operation result to the external output portion 76.

The external output portion 76 performs the same operation as the external output portion 18 shown in FIG. 1. That is, the external output portion 76 selectively outputs either the data received from the second operating portion 72 or a value corresponding to the specified input, as the final operation result of the digital data, via the output terminal OUT, in response to the double-delayed determination result from the second delay portion 74.

Though the low power consuming operating device having the two-stage pipe line structure has been described, it may adopt a multi-pipe line structure. For example, in a low power consuming operating device having a three-stage pipe line structure, a third internal input portion (not shown) and a third operating portion (not shown) are connected in series between the second operating portion 72 and the external output portion 76, and a third delay portion (not shown) is connected between the second delay portion 74 and the external output portion 76.

FIG. 5 is a circuit diagram of a conventional four-stage pipe line 16-bit multiplier for use in IDCT. The multiplier has a plurality of multiplexers 80 and D-flipflops 82, an operating portion 84, a plurality of D-flipflops constituting an output portion 86, and five flipflops constituting a state signal generating portion 88. The multiplexers 80 and D-flipflops 82 together constitute an input portion.

The multiplier shown in FIG. 5 multiplies data received via input terminals INA and INB and outputs the resulting value via an output terminal OUT1. For this purpose, each multiplexers 80 of the input portion selectively outputs either data received via the input terminal INA or INB or data received from a corresponding one of the D-flipflops 82, to the corresponding one of the D-flipflops 82 in response to the signal ENABLE. The input portion receives the data and outputs the data to the operating portion 84. The operating portion 84 multiplies the data received from the input portion 80. The multiplied data is output to the flipflops of the output portion 86, and data stored in the flipflop is output via an output terminal OUT1. Here, the state signal generating portion 88 outputs a state signal indicating that the data output from the output terminal OUT1 is the final operation result, via an output terminal OUT2.

Figure 6:
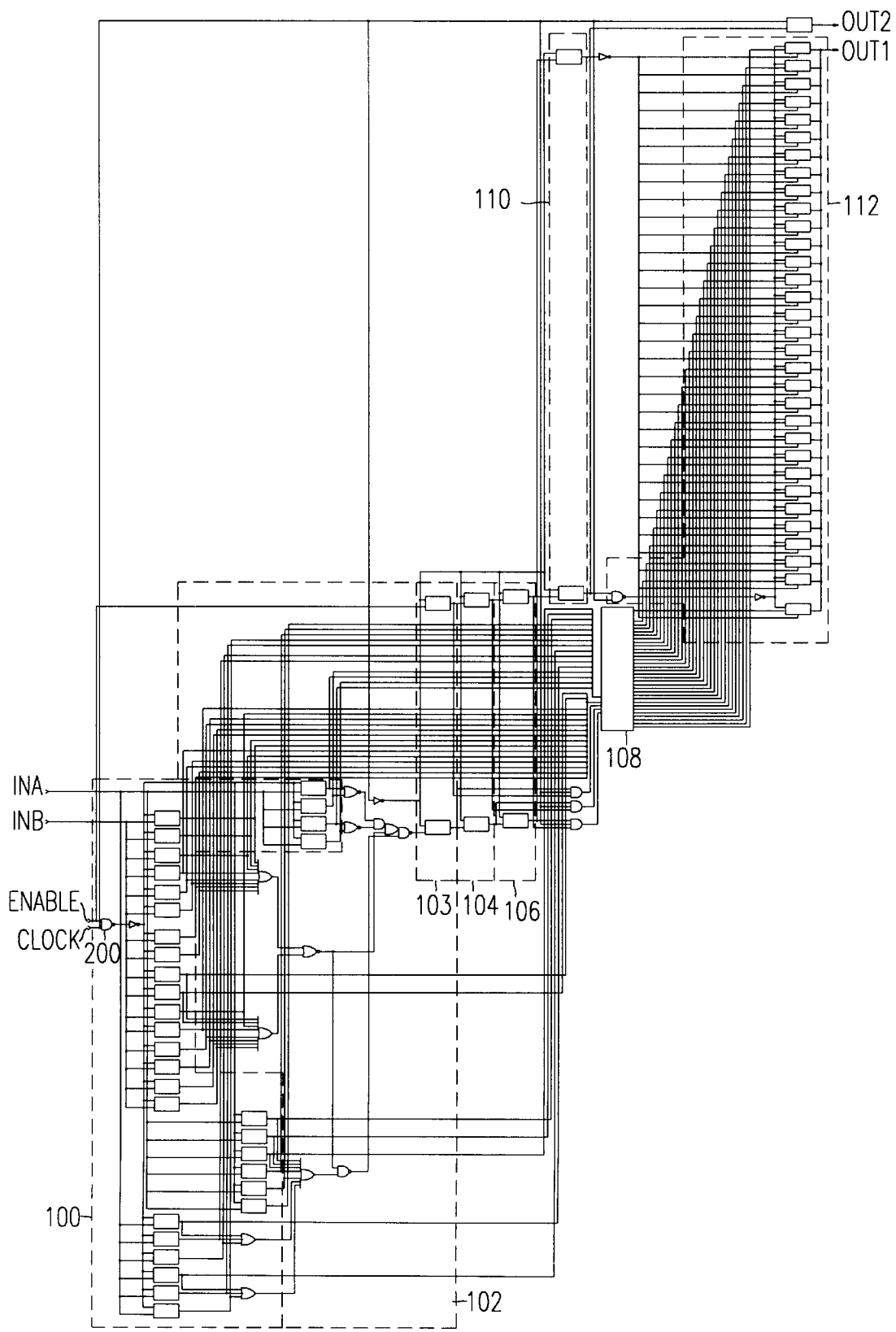
FIG. 6 is a circuit diagram of a preferred embodiment of a low power consuming operating device for performing multiplication operations, according to the present invention.

FIG. 6 is a circuit diagram of a preferred embodiment of a low power consuming operating device for multiplication, according to the present invention. The operating device for multiplication employs a four-stage pipe line structure, and has a plurality of flipflops and gates constituting an external input portion 100, gates and flipflops constituting a specified signal sensing portion 102, first to fourth delay portions 103, 104, 106, and 110, an operating portion 108 including an internal input portion (not shown), and gates and flipflops constituting an external output portion 112. Here, the operating portion 108 includes at least one internal input portion and as many operators as internal input portions. In addition, registers are constituted of not latches but flipflops and the multiplier operate in four stages, so that operation at 100MHz or above is possible at maximum.

The multiplier shown in FIG. 6 is a pipe line multiplier which senses a specified input '0'. When either of two operands input to the external input portion 100 is '0', the resulting multiplied value is '0'. The external input portion 100 receives the two operands to be multiplied via the input terminals INA and INB if both signals ENABLE and CLOCK are '1'. The specified signal sensing portion 102 outputs a logic low level control signal to the internal input portion (not shown) of the operating portion 108, thus preventing operation, if either operand is '0'. Power consumption in the operating portion 108 is reduced since an input value of the operator does not vary and thus the operator does not operate and the external output portion 112 outputs a predetermined resulting signal '0' via the output terminal OUT1. For this If purpose, the output of the predetermined signal sensing portion 102 is connected to the reset terminal of a corresponding flipflop of the external output portion 112, as shown in FIG. 6.

Meanwhile, a validity signal is output via the output terminal OUT2 to indicate that the signal output via the output terminal OUT1 is valid or not. The operating device of FIG. 6 uses a gated clock signal and has the specified signal sensing portion 102 for sensing the specified input '0', as compared with the operating device of FIG. 5.

Assuming that the operating devices of FIGS. 5 and 6 use the same internal operating portion in terms of structure and operation, the latter operating device is smaller than the former in circuit size since the latter adopts a gated clock method, thus needing no multiplexers in an input portion. Both multipliers will be compared under the following four conditions:

Condition 1. When neither input is '0', the multipliers of the prior art and the present invention perform the same operation and dissipate a similar amount of power. Actually, a controlling portion of the operating device of the present invention consumes power about 2% more. However, the increase is negligible. In any case, the condition 1 never happens in IDCT applications;

Condition 2. When neither input is '0' and an operation is not always necessary, the operating device of the present invention shows a 15% decrease in power consumption, since it uses a gated clock method. This assumes that the operating device operates 80% of the time. However in a real application, the operating device does not operate for even 10% of the time, as compared with the system. Therefore, a greater decrease of power consumption can be expected in a real situation;

Condition 3. When one of the two inputs is '0', power consumption of the multiplier of the present invention was decreased by about 80%, which implies that 80% of consumed power can be saved in this condition compared to the above conditions; and Condition 4. When the probability that one or both inputs are '0' is 26%, 26% of consumed power is saved in the multiplier of the present invention.

Approximately 20% saving of consumed power is expected by multiplying 26% of condition 4 by 80% of condition 3. However, the gated clock method in the input portion increased the overall power saving to 26%.

As described above, the probability that the inputs are '0' is 40% in the case of IDCT in MPEG or image compression applications. Thus, more saving of power can be expected.

The present applicant compared the operating devices of FIGS. 5 and 6 under the following conditions as shown in table 1.

Here, four-stage pipe line 16 bit×16 bit multipliers were used, a simulation frequency was 50MHz, an operation condition was 5V, a design library was TGC2000 (Texas Instrument 0.65 µm CMOS GateArray), and a gate level simulation method was employed.

TABLE 1

|  | conventional multiplier | multiplier of the present invention | remarks |
| --- | --- | --- | --- |
| size (gates) | 4630 | 4559 | 98.47% |
| power consumption (condition 1) | 114.9298 mW | 117.2804 mW | 102.06% |
| power consumption (condition 2) | 102.1868 mW | 87.1953 mW | 85.33% |
| power consumption (condition 3) | 66.4483 mW | 13.4930 mW | 20.94% |
| power consumption (condition 4) | 93.7079 mW | 69.7808 mW | 74.47% |

Here, the remarks column shows a percentage obtained by dividing a value of the multiplier of the present invention by a corresponding value of the conventional multiplier.

Meanwhile, the specified signal sensing portion 12 shown in FIG. 1 may determine, in a self-time method, whether a digital input signal received from the external input portion is a specified signal, as follows.

Figure 7:
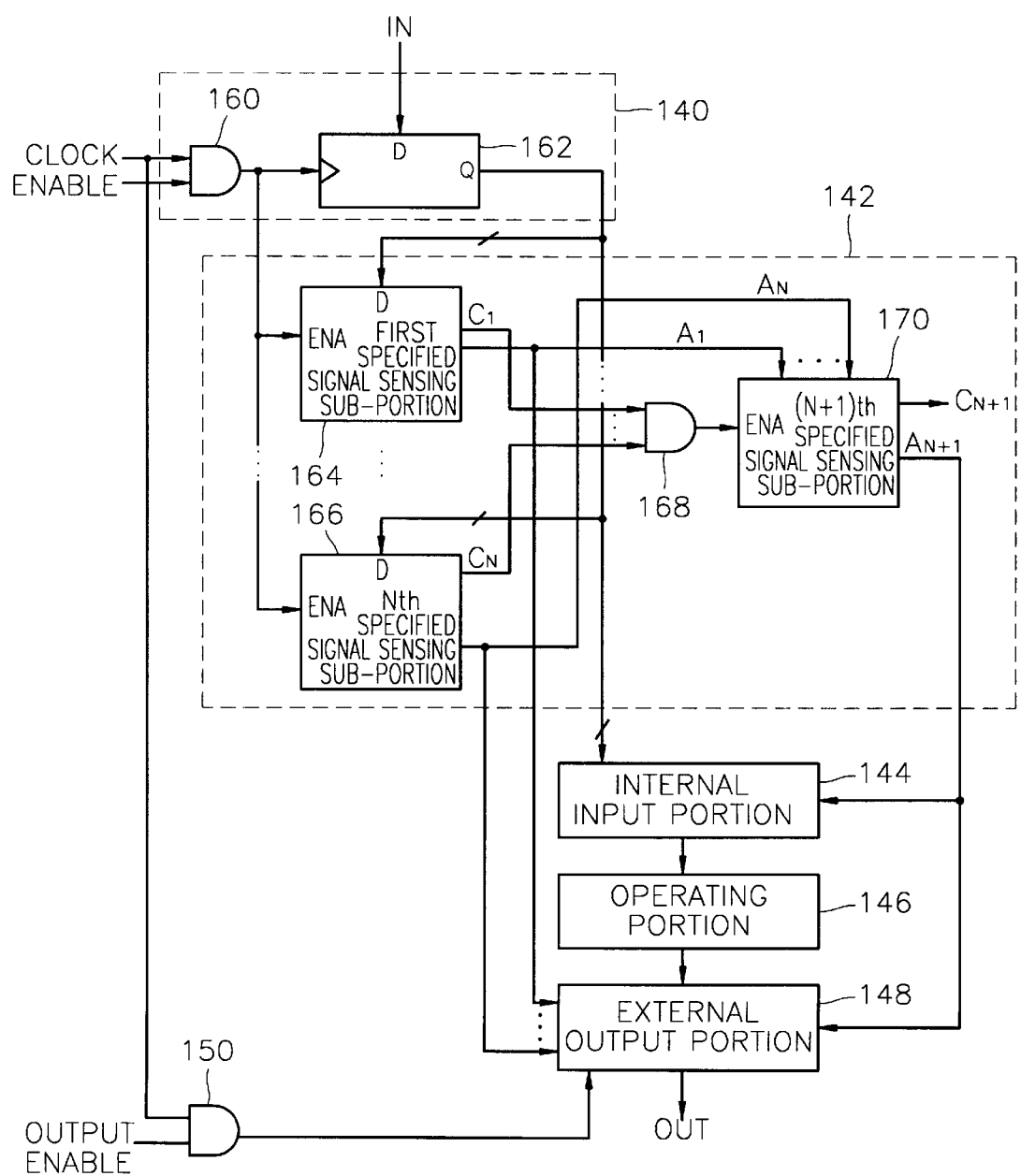
FIG. 7 is a block diagram of a preferred embodiment of a low power consuming operating device employing a self-timed specified signal sensor, according to the present invention.

FIG. 7 is a block diagram of a preferred embodiment of a low power consuming operating device using a self-timed specified signal sensing portion according to the present invention. The operating device includes an external input portion 140 constituted of an AND gate 160 and a D-flipflop 162, a specified signal sensing portion 142, an internal input portion 144, an operating portion 146) an external output portion 148, and an AND gate 150. The specified signal sensing portion 142 is constituted of first through (N+1)th specified signal sensing subportions 164, 166, . . . , 170 and an AND gate 168. Here, N is an integer greater than zero.

The external input portion 140 shown in FIG. 7 is a set of circuits like the one shown in FIG. 3. That is, it has the AND gate 160 corresponding to the AND gate 40 and the D-flipflop 162 corresponding to the D-flipflop 42, and receives digital data by a gated clock method.

An Xth($1 \leq X \leq N$) specified signal sensing subportions among the first through Nth specified signal sensing subportions 164, . . . , 166 performs a logic operation for its corresponding specified input among N specified inputs, using digital data received from the external input portion 140. This is performed using a a self-timed method, in response to the output of the AND gate 160. The result is output as an Xth determination result $A_x$ and an Xth determination end signal $C_x$. Here, the Xth determination result indicates whether the sensed digital data is a specified signal. If the digital data is not the specified signal, the Xth determination result is '1', and if the it is the specified signal or determination is not terminated, the Xth determination result is '0'. The Xth determination end signal indicates the completion of the determination of whether the digital data is the specified signal.

Here, first through Nth determination results are output from the first through Nth predetermined signal sensing subportions 164, . . . , 166 and 170 to the external output portion 148. On the other hand, the AND gate 168 performs a logic AND-operation on the first through Nth determination end signals and outputs the AND-operated result to the (N+1)th specified signal sensing subportion 170. The (N+1)th specified signal sensing subportion 170 operates on the first through Nth determination results using the self-timed method, in response to the output of the AND gate 168, and outputs the result as an (N+1)th determination result $A_{+1}$ to the internal input portion 144 and the external output portion 148. Here, the internal input portion 144 receives the digital data from the external input portion 140 in response to the (N+1)th determination result $A_{N+1}$, and outputs the input data to the operating portion 146. Therefore, untimely input of the digital data from the external input portion 140 to the internal input portion 144, due to a malfunction in outputting the determination result of the specified signal sensing portion 142, can be prevented.

Meanwhile, the external output portion 148 selectively outputs either the operation result of the operating portion 146 or the result corresponding to a specified input, via the output port OUT in response to the first through (N+1)th determination results A1, . . . , AN and $A_{N+1}$.

As described above, if there are a plurality of specified signals to be sensed, and operation results for the respective specified signals are all different, a plurality of specified signal sensing subportions are required in the specified signal sensing portion 142, as shown in FIG. 7. However, if there are a plurality of specified signals to be sensed which share the same operation result or if there is only a specified signal to be sensed, the specified signal sensing portion 142 has a single specified signal sensing subportion. Here, the single specified signal sensing subportion logically operates on the digital data received from the external input portion 140 using the self-timed method, in response to the output of the AND gate 160, and outputs the operation result as a determination result to the internal input portion 144 and the external output portion 148. Here, the logic operation is different according to a specified input.

Figure 8:
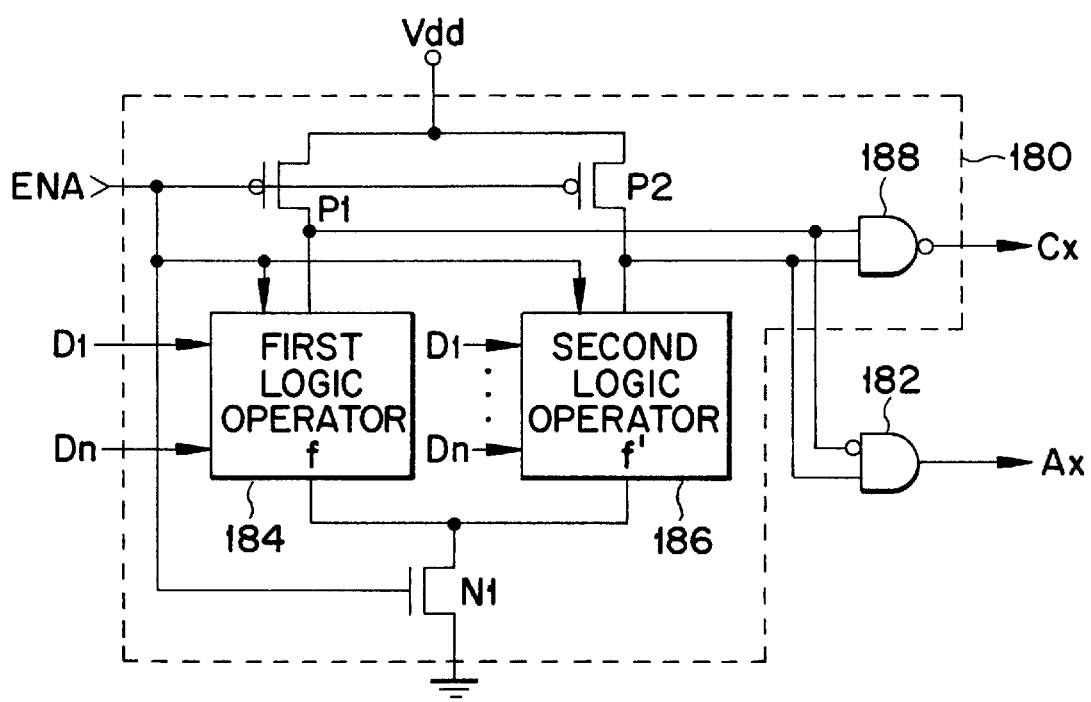
FIG. 8 is a circuit diagram of a preferred embodiment of the Xth specified signal sensing subportion shown in FIG. 7, according to the present invention.

FIG. 8 is a circuit diagram of a preferred embodiment of the Xth specified signal sensing subportion shown in FIG. 7. The X specified signal sensing subportion has an AND gate 182, and a differential cascade voltage switch logic (DCVSL) 180 which includes PMOS transistors P1 and P2, an NMOS transistor N1, a NAND gate 188, and first and second logic operators 184 and 186.

The DCSVL shown in FIG. 8 is described in "Synchronization Design for Digital Systems" by Teresa H. Meng in Stanford University, pp. 26–28.

That is, the PMOS transistors P1 and P2 shown in FIG. 8 are turned on or off in response to the output of the AND gate 160 shown in FIG. 7, that is, an enable signal ENA, and the NMOS transistor Ni is off or on when the PMOS transistors P1 and P2 are turned on or off, in response to the enable signal ENA, initially input at a logic low level. The NAND gate 188 performs a NAND-operation on the outputs of the first and second logic operators 184 and 186 and outputs the result as the Xth determination end signal $C_x$. The AND gate 182 performs an AND-operation on the inversion of the output of the first logic operator 184 and the output of the second logic operator 186, and outputs the result as the Xth determination result $A_x$. Meanwhile, the first and second logic operators 184 and 186 are enabled in response to the enable signal ENA, logically operate on an n-bit digital data $D_1, \ldots, D_n$ output from the external input portion 140 shown in FIG. 7, corresponding to specified signal, and output the logical operation results. Here, the logical operation results of the first and second logic operators 184 and 186 have a complementary relationship.

Meanwhile, the external output portion 18 or 148 shown in FIG. 1 or 7 employs flipflops which are set or reset asynchronously as described later in order to output a previously calculated value under control of the specified signal sensing portion 12 or 142 or to output the operation result received from the operating portion 16 or 146, in response to the determination result.

For example, assuming that the device shown in FIG. 7 is used in an inverse quantizer for a adaptive differential pulse code modulation (ADPCM) code, the operating device of the present invention operates as follows.

Figure 9:
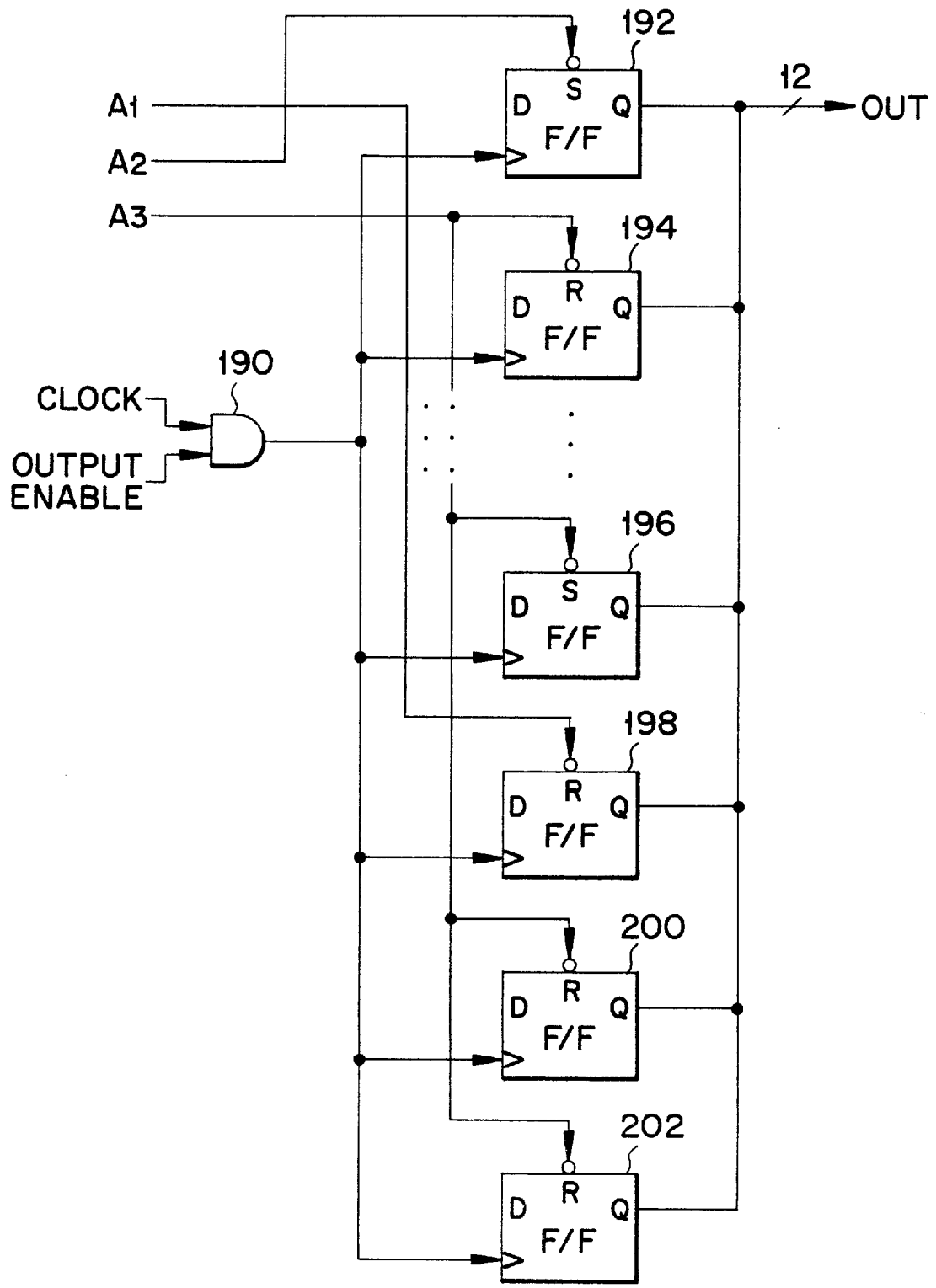
FIG. 9 is a circuit diagram of a preferred embodiment of the external output portion for ADPCM inverse quantization shown in FIG. 1 or 7.

FIG. 9 is a circuit diagram of a preferred embodiment of the external output portion 18 or 148 shown in FIG. 1 or 7 for use in an ADPCM inverse quantizer, according to the present invention. The external output portion 18 or 148 has an AND gate 190 and first through Pth flipflops 192, 194, . . . , 196, 198, 200, and 202 (here, P represents the number of bits of an operated value for a predetermined input).

Figure 10:
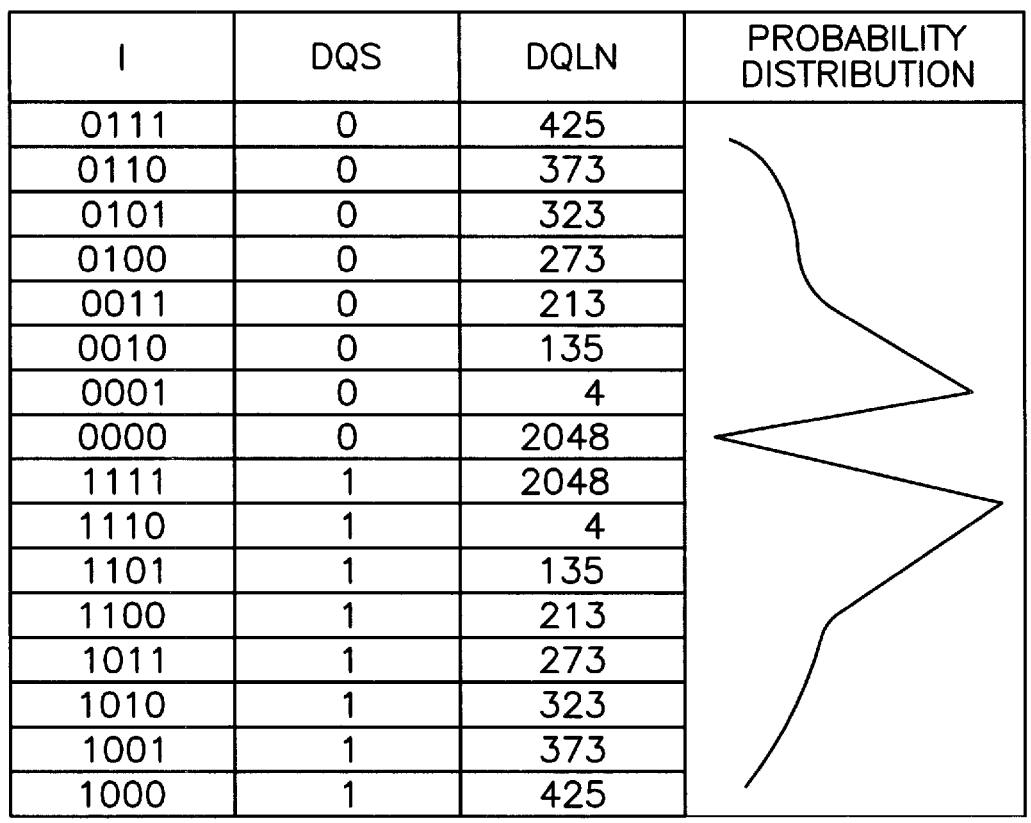
FIG. 10 illustrates input values, output values, and a probability distribution of input values, for an ADPCM inverse quantizer.

FIG. 10 illustrates the probability distribution of input values, output values and input values in the ADPCM inverse quantizer (not shown). Here, I indicates an input value, and output values DQS and DQLN indicate a sign bit of a quantized difference signal, and a normalized quantized difference signal, respectively.

"I" shown in FIG. 10 is a signal output from an adaptive quantizer for ADPCM, and DQS and DQLN are signals output from an adaptive predictor for ADPCM. Here, DQS can be achieved directly from the most significant bit (MSE) of input I, and DQLN can be achieved using the operating device shown in FIG. 7. For this purpose, the specified signal sensing portion 142 of the operating device shown in FIG. 7 determines whether highly probable digital data '0001', '1110', and '1111' in the digital input I are input. Here, since the specified signals '0001' and '1110' share the same operated value, they are sensed in a single specified signal sensing subportion. That is, the first specified signal sensing subportion 164 performs a logic operation as in equation (1) using a self-timed method, and using the circuit shown in FIG. 8, in order to determine whether the digital data received from the external input portion 140 is '0001' or '1110'.

$$f1 = a'b'c'd + abcd' \tag{1}$$

Here, f1 is a logic operation equation for the first specified signal sensing subportion 164 and used in the first logic operator 184 shown in FIG. 8, abcd indicates respective bits of the input I, and ' indicates a complement. If the digital data is a specified signal, f1 is '1', otherwise, f1 is '0'. If the digital data is not the specified signal, the first determination result A1 is '1', otherwise A1 is '0'.

Similarly, the second specified signal sensing subportion performs a logic operation as in equation (2) using a self-timed method in order to determine whether the digital data is '1111'.

$$f2 = abcd \tag{2}$$

Here, f2 indicates a logic operation equation for the second specified signal sensing subportion.

The third specified signal sensing subportion performs a logic operation as in equation (3) using a self-timed method in order to determine whether the first and second determination results A1 and A2 output from the first and second specified signal sensing portions are '1'.

$$f3 = \overline{A1 \cdot A2} \tag{3}$$

Here, f3 indicates a logic operation equation for the third specified signal sensing subportion. From equation (3), when the digital signal is not a specified signal, that is, A1 and A2 are '1', f3 is '0', and if f3 is '0' after a previous determination is over, A3 is '1'.

The first, second, and third determination results A1, A2, and A3, generated from equations (1), (2), and (3), are output from the specified signal sensing portion 142 to the external output portion 148 and the internal input portion 144. Then, when the digital data is a specified signal, the external output portion of FIG. 9 outputs as operated values corresponding to predetermined inputs the positive outputs of the respective flipflops set or reset in response to the first, second, or third determination result A1, A2, or A3 via the output port OUT. Therefore, the extenal output portion of FIG. 9 outputs DQLN of '1000_0000_0000' if the digital data is '1111' and DQLN of '0000_0000_0100' if the digital data is '0001' or '1110', via the output port OUT.

However, if the digital signal is not a specified signal, the flipflops of the external output portion shown in FIG. 9 ID output the operation results of the operating device 16 or 146, received via a data input port D, via the output port OUT in response to the output of the AND gate 190. Here, the AND gate 190 is the same as the AND gate 150 shown in FIG. 7, and performs an AND operation on a clock signals CLOCK and an output enable signal OUTPUT ENABLE, and outputs the AND-operation result as a clock signal for each flipflop.

As described above, the low power consuming operating device for digital signal processing according to the present invention minimizes power consumption and directly produces an output for a sensed specified input, found by calculating in advance the value of a specified signal frequently input, by analysis of the input signal to the system and the algorithm used, and outputting the previously calculated value when this specified signal is received. Also, the operating device operates only when necessary. As a result, the average operation speed of the system is increased, especially with a higher probability of any inputs. In addition, an additional delay portion, which is made in a specified signal sensing portion is minimized, and operational failures caused by impulsive noise can be prevented owing to a self-timed sensing of a predetermined signal.

While the present invention has been illustrated and described with reference to specific embodiments, further modifications and alterations will occur to those skilled in the art within the spirit and scope of this invention.

What is claimed is:

1. A low power consuming operating device for digital signal processing, comprising:

external input means for receiving digital data, temporarily storing the digital data, and outputting the stored data;

specified signal sensing means for determining whether the digital data received from the external input means is a specified input of which occurrence probability is greater than a predetermined value and outputting the determination result;

internal input means for outputting the digital data except for the specified input received from the external input means, in response to the determination result;

operating means for operating on the data output from the internal input means and temporarily storing the operating result; and external output means for selectively outputting either the temporarily stored output of the operating means or a value corresponding to the specified input, as the final operation result of the digital data, in response to the determination result wherein when said value is output said value is output without passing through the operating means.

2. The low power consuming operating device as claimed in claim 1, wherein the external input means comprises:

first AND means for AND-operating an enable signal and a clock signal; and a D-flipflop for receiving the output of the first AND means as a clock signal and the digital data as data, and outputting the digital data as a positive output.

3. The low power consuming operating device as claimed in claim 2, wherein the specified signal sensing means comprises subordinate specified signal sensing means for logically operating on the digital data received from the external input means, using a self-timed method, in response to the output of the first AND means, according to the specified input, and outputting the logical operation result as the determination result.

4. The low power consuming operating device as claimed in claim 2, wherein the predetermined signal sensing means comprises:

first through Nth subordinate specified signal sensing means, each for logically operating on the digital data received from the external input means, according to a corresponding specified input among the N specified inputs (where N is an integer greater than zero), using a self-timed method, in response to the output of the first AND means, and outputting the logical operation result as one of first through Nth determination results and one of first through Nth determination end signals;

second AND means for AND-operating the first through Nth determination end signals and outputting the AND-operated result; and an (N+1)th subordinate specified signal sensing means for logically operating on the first through Nth determination results, using a self-timed method, in response to the output of the second AND means, and outputting the logical operation result as an (N+1)th determination result, wherein the first through Nth determination results are output as the determination result to the external output means, and the (N+1)th determination result is output as the determination result to the internal input means.

5. The low power consuming operating device as claimed in claim 3, wherein the external output means comprises as many flipflops as the number of bits of an output value corresponding to the specified input, wherein one of set and reset terminals of each flipflop is connected to the determination result according to the output value corresponding to the specified input, the flipflop receives the output of the operating means as data and the output of the first AND means as a clock signal, and a signal output from the flipflops is the final operation result of the digital data.

6. The low power consuming operating device for digital signal processing as claimed in claim 4, wherein the external output means comprises as many flipflops as the number of bits of an output value corresponding to the specified input, wherein one of set and reset terminals of each flipflop is connected to one of the first through (N+1)th determination results according to the output value corresponding to the specified input, the flipflop receives the output of the operating means as data and the output of the first AND means as a clock signal, and a signal output from the flipflops is the final operation result of the digital data.

7. A low power consuming operating device for digital signal processing, comprising:

external input means for receiving digital data, temporarily storing the received digital data, and outputting the stored data;

specified signal sensing means for receiving the digital data from the external input means, determining whether the received digital data is a specified input obtained from said sensing means, and outputting the determination result;

first internal input means for outputting the digital data received from the external input means, in response to the determination result;

first operating means for receiving the data from the first internal input means and operating on the received data;

first delay means for delaying the determination result and outputting the delayed determination result;

second through nth internal input means (where n is an integer greater than one);

second through nth delay means;

second through nth operating means; and an external output means for selectively outputting either the data received from the nth operating means or an output value corresponding to the specified input, in response to the output of the nth delay means, as the final operation result of the digital data, wherein when said output value is output said output value is output without passing through the n operating means, wherein the nth internal input means outputs data received from the (n-1)th operating means, in response to the output of the (n-1)th delay means, the nth operating means operates on the data received from the nth internal input means, and the nth delay means delays the output of the (n-1)th delay means and outputs the delayed output.

* * * * *